United States Patent [19]

Yamaguchi et al.

[11] Patent Number: 5,110,789
[45] Date of Patent: May 5, 1992

[54] SUPERCONDUCTIVE CERAMIC WIRE AND METHOD FOR MAKING SAME

[75] Inventors: Tetsuro Yamaguchi, Urawa; Takuo Takeshita, Omiya; Sadaaki Hagino, Urawa, all of Japan

[73] Assignee: Mitsubishi Materials Corporation, Tokyo, Japan

[21] Appl. No.: 559,379

[22] Filed: Jul. 25, 1990

Related U.S. Application Data

[60] Continuation of Ser. No. 237,580, Aug. 29, 1988, abandoned.

[30] Foreign Application Priority Data

Aug. 27, 1987 [JP] Japan ................................ 62-213775

[51] Int. Cl.$^5$ .............................................. H01B 12/00
[52] U.S. Cl. ............................................ 505/1; 29/599; 174/125.1; 505/887; 505/917
[58] Field of Search ..................... 174/125.1; 29/599; 505/704, 740, 884, 887, 917, 1

[56] References Cited

FOREIGN PATENT DOCUMENTS 0281444 9/1988 European Pat. Off. .

OTHER PUBLICATIONS

Okada, M. et al; Fabrication of Ag-Sheathed Ba-Y-Cu Oxide Superconductor Applied Physics Letters, S.C. Powder Encapsulation in Ag.

Soeta, A. et al; Microstructures of $YBa_2Cu_3O_{7-\delta}$ with Various Critical Current Densities; Extended Abstracts Material Research Society; Apr. 5-9, 1988 (Reno, Nev.), pp,. 243-245. High-Temperature Superconductors II.

Yamada, Y. et al.; Critical Current Density of Wire Type Y-Ba-Cu Oxide Superconductor; vol. 26, No. 5, May 1987, pp. L865-L866.

Saito, Y. et al; Composition Dependence of Superconductivity in $(Ba_{0.1}La_{1.9})Ag.Cu_{1-x}O_{4-y}$ System; Japanese Journal of Applied Physics; vol. 26, No. 5, May. 1987.

Primary Examiner—Morris H. Nimmo
Attorney, Agent, or Firm—Cushman, Darby & Cushman

[57] ABSTRACT

The present invention is related to a superconductive ceramic wire and a method for making same.

According to the first aspect of the invention, there is provided a method for making a superconductive ceramic wire, the method comprising the steps of: (a) preparing a superconductive porous ceramics; (b) depositing lead in the pores of the ceramics; (c) covering the lead-deposited ceramics with a metal; and (d) extending the metal-clad and lead-deposited ceramics.

According to the second aspect of the invention, there is provided a superconductive ceramic wire which is obtained by: (a) preparing a superconductive porous ceramics; (b) depositing lead in the pores of the ceramics; (c) covering the lead-deposited ceramics with a metal; and (d) extending the metal-clad lead-deposited ceramics.

8 Claims, 1 Drawing Sheet

SUPERCONDUCTIVE CERAMIC WIRE AND METHOD FOR MAKING SAME

This is a continuation of application Ser. No. 07/237,580, filed Aug. 29, 1988, which was abandoned upon the filing hereof now abandoned.

1. BACKGROUND OF THE INVENTION

The present invention is related to a superconductive ceramic wire and a method for making same.

It has been known that composite oxides, referred to as superconductive ceramics hereinafter, composed mainly of yttrium-including a rare earth element (denoted hereinafter by R), an alkaline earth metal, copper and oxygen show a superconductivity at a temperature of 77° K. which is higher than the boiling point of nitrogen.

A conventional method for making the above-mentioned superconductive ceramics is as follows.

First, powdery raw materials, that is, an R oxide ($R_2O_3$), a carbonate of an alkaline earth metal and copper oxide (CuO), average particle diameter being not larger than 10 um, are mixed at a molecular proportion of 0.5:2:3, respectively.

Second, the mixed raw materials are heat-treated at a temperature between 850° C. and 950° C. for at least 24 hours in an oxygenous atmosphere to form a superconductive ceramic powder.

In order to obtain a superconductive ceramic wire, the superconductive ceramic powder is sintered to make a sintered block thereform. The block is then charged in a silver or copper pipe, and a diameter thereof is reduced to be on the order of 5 mm by cold swaging, rolling or dieing. Another conventional method for diametrical reduction is to hot extrude the sintered ceramic block.

A problem of the above-mentioned conventional processing for obtaining a superconductive ceramic wire is that fissures and hollows are apt to be created in the superconductive material during the diametrical reduction because of the poor extensibility of ceramic. As the fissures and hollows spoil superconductivity, namely the critical temperature and the critical electric current density Jc, of the material, the diametrical reduction rate has to be kept lower than a certain level. A disadvantage of the superconductive ceramic wire obtained by a conventional method is that the diameter of the wire is not enough small and the material often has fissures and hollows which spoil the superconductivity. Therefore, electric resistance and critical electric current density which might be obtained in a massive superconductive ceramics is not obtained in the superconductive ceramic wires of the conventional process.

2. SUMMARY OF THE INVENTION

An object of the method for making superconductive ceramic wire according to the first aspect of the present invention is, therefore, to provide a method for making a superconductive ceramic wire which allows a high diametrical reduction of the wire. Another object of the present invention is to provide a method by which creation of fissures and hollows in the wire is restrained. A further object of the invention is to provide a method for making a superconductive ceramic wire having superconductivity and high Jc. By virtue of the extensibility of lead depositted in the pores of the superconductive material, fissures and hollows are prevented from occurring. Even if they occur, they are filled with the lead.

A second aspect of the present invention provides a superconductive ceramic wire having a small diameter. Another object of the second aspect is to provide a superconductive ceramic wire having relatively few fissures and hollows therein. A further object thereof is to provide a superconductive ceramic wire having superconductivity at a boiling point of nitrogen and a high Jc.

According to the first aspect of the present invention, there is provided a method for making a superconductive ceramic wire, the method comprising the steps of: (a) preparing a superconductive porous ceramic; (b) depositing lead in the pores of the ceramic; (c) covering the lead-deposited ceramic with a metal; and (d) extending the metal-clad and lead-deposited ceramic.

According to the second aspect of the present invention, there is provided a superconductive ceramic wire which is obtained by: (a) preparing a superconductive porous ceramics; (b) depositing lead in the pores of the ceramics; (c) covering the lead-deposited ceramics with a metal; and (d) extending the metal-clad and lead-deposited ceramics.

3. BRIEF DESCRIPTION ON THE DRAWINGS

4. DETAILED DESCRIPTION OF THE PREFERRED EMBODIMENTS OF THE INVENTION

Figure 1:
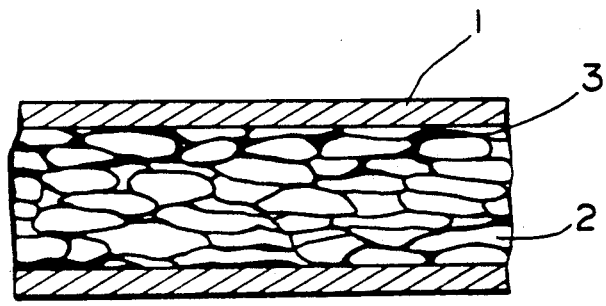
FIG. 1 shows schematically a cross-section of a superconductive wire obtained according to the present invention.

A preferred embodiment of the present invention will now be explained.

According to an embodiment of a method for making a superconductive ceramic wire, lead is laid in the pores of a superconductive porous ceramic essentially composed of an yttrium-including rare earth element, an alkaline earth metal, copper and oxygen. The lead depositted superconductive ceramic is covered by a metal sheath. Then, the metal-clad and lead deposited superconductive ceramics is extended. The lead deposited in the bores acts as a lubricator while the material is extended with the metal sheath. When fissures and hollows are formed in the superconductive material during the extension, the lead fills the defects to moderate their negative effects on the superconductivity. Thus a superconductive wire with little fissures and hollows is made. Lead has been used to fill the pores because lead is soft, has substantial extensibility and deformability, and consequently considerable workability and superconductivity, though it appears at as low a temperature as 9° K.

Preferably, the total amount of lead filling the hollow spaces in the ceramics is between 5% and 40% by volume of the porous superconductive ceramics. If the proportion is smaller than 5%, critical temperature becomes lower than 77° K. because of substantial fissures and hollows existing between ceramic particles. If the proportion is higher than 40%, the critical temperature and the critical current density decrease because ceramic particles are out of contact with each other because of lead layers coming therebetween.

Pores in the ceramic material are not easily filled with lead because the two materials are not affinitive to each other. By chemical-plating a copper or tin layer on the porous superconductive ceramic, lead can be deposited thereon effectively. The chemical-plating also increases the bonding strength between the ceramic and metal sheath, consequently largely improving the extension rate and workability of the material.

As explained above, a method for making superconductive ceramic wire according to the first aspect of the present invention enables a high diametrical reduction in extending the wire. The method restrains the creation of fissures and hollows in the wire during the extension process. It becomes possible to perform a extension at a extension rate higher than 80% while maintaining a superconductivity of a base material. Further, the method enables making a superconductive ceramic wire having superconductivity at a high temperature and also having a high Jc. Superconductive ceramic wire according to the second aspect of the present invention has a small diameter and has few fissure and hollows therein. Further, the superconductive wire has superconductivity at a high temperature and a high Jc.

Further, the copper sheath for retaining superconductive ceramics therein may be replaced by a silver sheath and the copper plating formed on the porous ceramics may be replaced by a tin plating.

5. EXAMPLES

A superconductive ceramic wire is made according to the first aspect of the present invention.

The following raw materials, from (1) to (3), are prepared.

(1) Yttrium oxide ($Y_2O_3$) in a powdery state having an average particle diameter of around 6 um.

(2) Barium carbonate ($BaCO_3$) in a powdery state having an average particle diameter of around 6 um.

(3) Copper oxide (CuO) in a powdery state having an average particle diameter of around 6 um.

The above raw materials are mixed at a following molecular ratio.

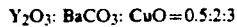

$Y_2O_3: BaCO_3: CuO = 0.5:2:3$

Then, the mixture of the raw materials is heat treated at a temperature of 900° C., for 24 hours and in an atmosphere to obtain a superconductive ceramic material having a composition of $YBa_2Cu_3O_7$ and a perovskite structure.

Next, thus obtained superconductive ceramic material is pulverized to a superconductive powder having an average particle diameter of 5 um.

The superconductive ceramic powder is mixed with a binder, paraffin or stearic acid for example, and formed in a cylindrical shape of 20 mm in diameter and 100 mm in length.

The formed ceramic powder is heat-treated at a temperature of 930° C. for 24 hours at an oxygenous atmosphere and a porous superconductive ceramic pellet is obtained.

Copper is chemical-plated on the porous ceramic pellet in order to improve the affinity of the pellet to lead. More specifically, the ceramic pellet is surface treated by palladium to form a catalyst layer of palladium thereon. Then copper ions are depositted to form a layer of copper thereon. The thickness of the copper layer is about 1 um. Moisture is removed from the surface thereof. A tin layer may be formed by substituting the copper with tin.

The copper clad ceramic pellet is soaked in pressurized molten lead and the molten lead is deposited in the pores formed in the pellet. The amount of lead depositted in the pellet is varied as shown in Table 1.

The thusly obtained ceramic pellet having a lead deposition formed therein is sheathed in a copper tube of 23 mm in outer diameter, 20 mm in inner diameter and 200 mm in length.

Finally, the pellet and the copper tube are rotary swaged and died so as to reduce its diameter to 1 mm. Thus, a superconductive ceramic wire is obtained. The diametrical reduction rate of the extension processing is 95.1%.

Figure 2:
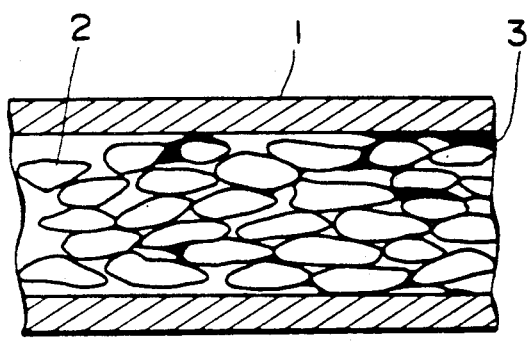
FIG. 2 shows schematically a cross-section of a superconductive wire wherein the amount of lead depositted is insufficient.
Figure 3:
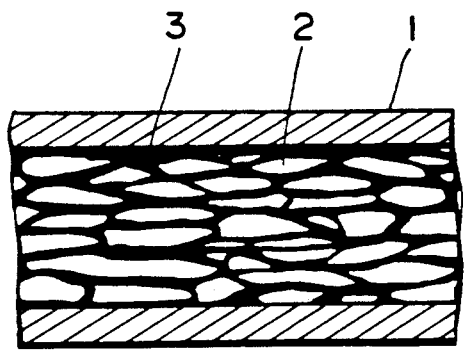
FIG. 3 shows schematically a cross-section of a superconductive wire wherein an excessive amount of lead is depositted.

Table 1 shows the critical temperature Tc(°K.) and critical electric current density at 77° K ($A/cm^2$) of the ceramic wire. FIGS. 1, 2 and 3 show schematically a cross section of the ceramic wires Example No. 4, 2 and 6, respectively. Superconductive ceramic particles 2 are in contact with each other but also have openings therebetween. Lead 3 is depositted in some of the openings. The ceramic particles 2 and the lead 3 are sheathed in a copper tube 1.

As to the example No. 4 shown in FIG. 1 wherein the amount of depositted lead is 15% of the ceramic material, most of the outer openings are filled with the lead but the inner openings remain vacant. Table 1 shows that the Example No. 4 has both a high critical temperature (91° K.) and a high critical electric current density (4,700 $A/cm^2$). The characteristics are obtained when only the outer openings are filled with lead and the inner openings are left vacant as in this example.

As to the Example No. 2 shown in FIG. 2 wherein the amount of lead is 3% of the ceramic material by volume, some of the outer openings are filled with the lead but there remain vacant openings also at an outer side. Inner openings are vacant. In this example, the amount of lead is not enough and fissures and hollows create obstacles to current flow.

As to the Example No. 6 shown in FIG. 3 wherein the amount of lead is 50% by volume, virtually all the openings are filled with lead. Further in this example, lead layer layers separate particles thus increasing resistance therebetween.

The comparative study shows that good results are obtained when the amount of lead deposited in the superconductive ceramic pellet is between 5% and 40%, that is, examples No. 3, 4 and 5.

TABLE 1

| No. | proportion of lead deposition by ceramic material (volume %) | Critical temperature Tc (°K.) | Critical Electric Current Density Jc ($A/cm^2$) at 77° K. |
|---|---|---|---|
| 1 | 0 | — | no superconductivity |
| 2 | 3 | 93 | 1,600 |
| 3 | 5 | 91 | 4,700 |
| 4 | 15 | 90 | 4,600 |
| 5 | 40 | 92 | 2,600 |
| 6 | 50 | 90 | 700 |

What is claimed is:

1. A superconducting ceramic wire which is obtained by:

(a) preparing an elongated superconducting porous member consisting essentially of superconducting ceramic particles;
(b) depositing lead in the pores of the elongated superconducting ceramic member;
(c) covering the lead-deposited elongated member with a metal clad; and
(d) extending the lead-deposited elongated member and the metal clad.

2. A superconducting ceramic wire which is obtained by:
(a) mixing powdery yttrium oxide, powdery barium carbonate, powdery copper monoxide at a molecular proportion of 1:4:6;
(b) making a compound having a composition of YBa2Cu3O7 and a perovskite structure by heat-treating the powdery mixture;
(c) pulverizing the compound;
(d) mixing the pulverized compound with a binding material;
(e) heat-treating the mixture to obtain an elongated superconducting porous member consisting essentially of superconducting ceramic particles;
(f) making a layer of copper on the elongated member by chemical plating;
(g) soaking the copper-clad elongated member in molten lead so that between 5% and 40% by volume of lead is deposited between the superconducting porous ceramic particles;
(h) covering the lead-deposited elongated member with a copper sheath; and
(i) extending the lead-deposited elongated member covered with the copper sheath at a diametric reduction rate higher than 80%.

3. A superconducting ceramic wire comprising:
(a) a core including superconducting ceramic particles and lead filling the pores between the superconducting ceramic particles; and
(b) a metal sheath covering the core.

4. A superconducting ceramic wire according to claim 3 which further comprises a copper layer between the core and the sheath.

5. A superconducting ceramic wire according to claim 3 which further comprises at least one tin layer disposed between the superconducting ceramic particles and the lead filling.

6. A superconducting ceramic wire according to claim 3 wherein the superconducting ceramic particles are consisting essentially of yttrium-including rare earth elements, alkaline earth metal, copper and oxygen.

7. A superconducting ceramic wire according to claim 3 wherein the amount of lead filling the pores of the superconducting ceramic particles is between 5% and 40% by volume of that of the superconducting ceramic particles.

8. A superconducting ceramic wire according to claim 3 wherein the metal sheath is made of a material selected from the group consisting of copper and silver.

* * * * *